United States Patent
Bluck et al.

(10) Patent No.: US 9,850,570 B2
(45) Date of Patent: Dec. 26, 2017

(54) ION IMPLANTATION FOR MODIFICATION OF THIN FILM COATINGS ON GLASS

(71) Applicant: Intevac, Inc., Santa Clara, CA (US)

(72) Inventors: Terry Bluck, Santa Clara, CA (US); Babak Adibi, Los Altos, CA (US)

(73) Assignee: INTEVAC, INC., Santa Clara, CA (US)

( * ) Notice: Subject to any disclaimer, the term of this patent is extended or adjusted under 35 U.S.C. 154(b) by 0 days.

(21) Appl. No.: 15/203,747

(22) Filed: Jul. 6, 2016

(65) Prior Publication Data

US 2017/0009337 A1    Jan. 12, 2017

Related U.S. Application Data

(60) Provisional application No. 62/189,176, filed on Jul. 6, 2015.

(51) Int. Cl.
| | | |
|---|---|---|
| B32B 15/04 | (2006.01) | |
| B32B 17/06 | (2006.01) | |
| C23C 14/48 | (2006.01) | |
| C03C 17/245 | (2006.01) | |
| C23C 14/06 | (2006.01) | |
| C23C 14/08 | (2006.01) | |
| C23C 14/56 | (2006.01) | |

(52) U.S. Cl.
CPC ............ *C23C 14/48* (2013.01); *C03C 17/245* (2013.01); *C23C 14/0652* (2013.01); *C23C 14/083* (2013.01); *C23C 14/568* (2013.01)

(58) Field of Classification Search
USPC ....... 428/409, 410, 426, 428, 432, 433, 434, 428/688, 689, 697, 698, 699, 701, 702
See application file for complete search history.

(56) References Cited

U.S. PATENT DOCUMENTS

| | | | |
|---|---|---|---|
| 6,280,834 B1* | 8/2001 | Veerasamy | B05D 5/083 428/212 |
| 6,303,225 B1* | 10/2001 | Veerasamy | B05D 5/083 428/408 |
| 6,312,808 B1* | 11/2001 | Veerasamy | B05D 5/083 428/217 |
| 6,335,086 B1* | 1/2002 | Veerasamy | B05D 5/083 428/212 |
| 6,447,891 B1* | 9/2002 | Veerasamy | B05D 5/083 428/216 |

(Continued)

OTHER PUBLICATIONS

PVD Advanced Technologies (http://www.pvdadvancedtech.com/dlc/).*

(Continued)

*Primary Examiner* — Lauren R Colgan
(74) *Attorney, Agent, or Firm* — Womble Bond Dickinson (US) LLP; Joseph Bach, Esq.

(57) ABSTRACT

The use of non-mass analyzed ion implanter is advantageous in such application as it generates ion implanting at different depth depending on the ions energy and mass. This allows for gaining advantage from lubricity offered as a result of the very light deposition on the surface, and at the same time the hardness provided by the intercalated ions implanted below it, providing benefits for cover glass, low E enhancement, and other similar materials. In further aspects, ion implantation is used to create other desirable film properties such anti-microbial and corrosion resistance.

10 Claims, 3 Drawing Sheets

(56) References Cited

U.S. PATENT DOCUMENTS

| | | | | |
|---|---|---|---|---|
| 6,461,731 | B1* | 10/2002 | Veerasamy | B05D 5/083 428/408 |
| 7,052,585 | B2* | 5/2006 | Veerasamy | C03C 17/22 204/192.16 |
| 7,550,067 | B2* | 6/2009 | Veerasamy | C03C 17/3435 204/192.23 |
| 2002/0127404 | A1* | 9/2002 | Veerasamy | C03C 17/22 428/408 |
| 2004/0067362 | A1* | 4/2004 | Veerasamy | C03C 17/22 428/408 |
| 2004/0067363 | A1* | 4/2004 | Bienkiewicz | C03C 17/22 428/408 |
| 2004/0137235 | A1* | 7/2004 | Paul | C03C 17/36 428/432 |
| 2006/0008656 | A1* | 1/2006 | Veerasamy | B32B 17/10036 428/434 |
| 2006/0070869 | A1* | 4/2006 | Krisko | C03C 17/36 204/192.15 |
| 2007/0254163 | A1* | 11/2007 | Veerasamy | C03C 17/36 428/432 |
| 2009/0324967 | A1* | 12/2009 | Disteldorf | C03C 17/36 428/428 |
| 2010/0326835 | A1* | 12/2010 | Speitling | A61L 27/06 205/109 |
| 2013/0094076 | A1* | 4/2013 | O'Connor | C03C 17/36 359/360 |
| 2013/0216860 | A1* | 8/2013 | Imran | C03C 17/3618 428/623 |
| 2013/0216861 | A1* | 8/2013 | Imran | C23C 14/35 428/630 |
| 2013/0273377 | A1* | 10/2013 | Veerasamy | C03C 17/2453 428/432 |
| 2014/0272454 | A1* | 9/2014 | Zhang | C03C 17/3681 428/623 |

OTHER PUBLICATIONS

Oerlikon metco, May 2017.*
Prakash et al. ("The Lubcricity of Oxides Revised Based on a Polarisability Approach") Tribol Lett (2007) 27:105-112.*
DifferencesBetween.com.*

* cited by examiner

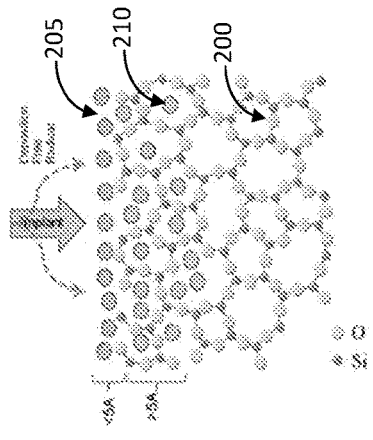
*Figure 1A*
*Prior Art*
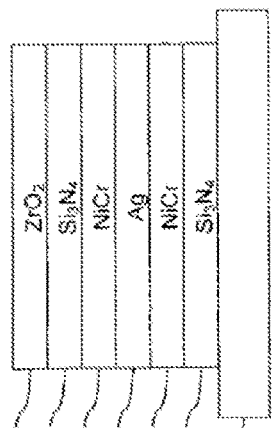
*Figure 1B*
*Prior Art*
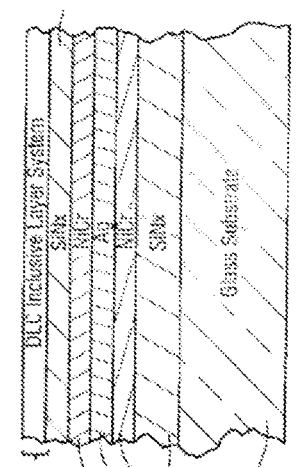
*Figure 3*
*Figure 2*
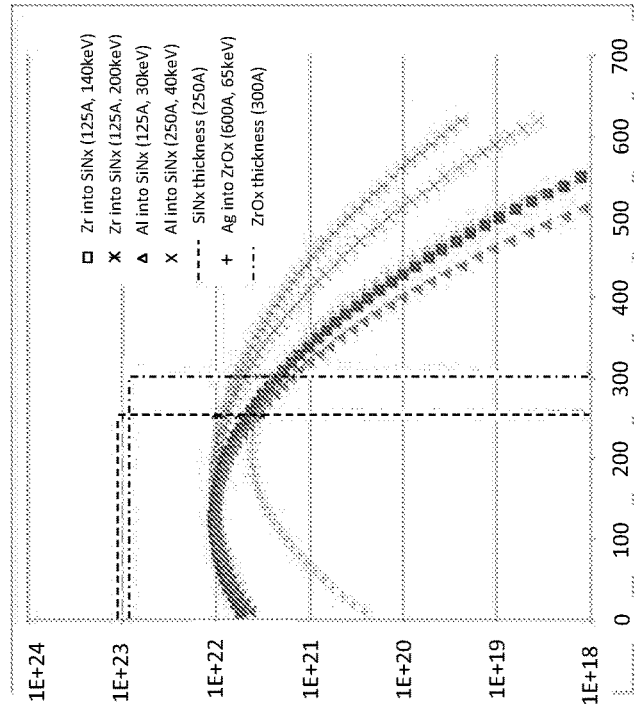
*Figure 4*

ION IMPLANTATION FOR MODIFICATION OF THIN FILM COATINGS ON GLASS

RELATED APPLICATION

This Application claims priority benefit from U.S. Provisional Application Ser. No. 62/189,176, filed on Jul. 6, 2015, the disclosure of which is incorporated herein in its entirety.

BACKGROUND

1. Field

This disclosure relates to enhancing the properties of coatings that are applied onto glass panels, such as low-E (i.e. low emissivity) glass.

2. Related Art

For many architectural purposes it is desirable to have as low an emissivity and Rs value as feasible, such that the glass window is reflecting substantial amounts of the infrared energy impinging on the glass. Generally speaking, "low-E" (i.e. low emissivity) glasses are considered to be those glasses which have a hemispherical emissivity (Eh) of less than about 0.16 and a normal emissivity (En) of less than about 0.12. Preferably, Eh is about 0.13 or less, and En is about 0.10 or less. At the same time, sheet resistance (Rs) is, therefore, preferably less than about 10.5 ohms/square. Such glasses, to be commercially acceptable, usually are required to transmit as much visible light as possible, often about 76% or more using the Illuminant C technique for measuring transmittance in glasses of about 2 mm-6 mm thick. Visible transmittance, in this respect, should more preferably be at least about 78% or greater for glasses between about 2 mm-6 mm thick. Even more preferably, visible transmittance should be about 80% or greater, and still most preferably, greater than about 80%.

The technique of creating architectural glass by magnetron sputter-coating multiple layers of metal and/or metal oxides or nitrides onto float glass sheets is well known and a large number of permutations and combinations of known metals (e.g. Ag, Au, etc.), oxides and nitrides have been attempted and reported. Such techniques may employ either planar or tubular targets, or a combination of both, in multi-target zones to achieve their desired results. Exemplary of preferred apparatus for use in this invention, and known in the art, is a magnetron sputter-coater sold by Airco Corporation. This commercially available device is disclosed in U.S. Pat. Nos. 4,356,073 and 4,422,916, respectively. The disclosures of these patents are incorporated herein by reference.

In particular, it has been known to use the aforesaid Airco sputter-coater to produce architectural glasses having a layering system, sequentially from the glass (e.g. standard float glass) outwardly, as follows: an undercoat layer of $Si_3N_4$, a first layer of nickel or nickel alloy, a layer of silver, a second layer of nickel or nickel alloy, and an overcoat layer of $Si_3N_4$. As one example, the coating may comprise $Si_3N_4$/Ni:Cr/Ag/Ni:Cr/$Si_3N_4$, in which it has been found in practice that the Ni:Cr alloy is 80/20 by weight Ni/Cr, respectively (i.e. nichrome), and wherein the two nichrome layers are reported as being 7 Å thick, the Ag layer is specified as being only about 70 Å thick, and the $Si_3N_4$ layers are relatively thicker (e.g. 320 Å for the undercoat and about 450 Å for the overcoat). In reality, because of its thinness (i.e. about 70 Å), the silver (Ag) layer has been found, in practice, to actually be rather semi-continuous in nature. In certain instances, these layer system consists essentially of a seven-layer system created by severing the silver layer into two silver layers with a nickel-based (e.g. nickel-chrome) layer in between, such that the layer system from the glass outwardly now consists essentially of: $Si_3N_4$/Ni:Cr/Ag/Ni:Cr/Ag/Ni:Cr/$Si_3N_4$.

The problem is the films are not typically durable and can be damaged easily in handling and shipping. The industry typically puts a removable protective thin film over the final layer to protect the low e coatings from damage due to handling and the environment. In other instances a permanent hard coating is provided, such as diamond-like coating (DLC) to enhance the scratch resistance of the low-E coating. Two examples are illustrated in FIGS. 1A and 1B, using DLC and Zirconium dioxide (zirconia), respectively.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed aspects provide enhancement to the standard low-E glass coating. According to some aspects, non-mass analyzed ion beam is used to enhance the durability of the coating on Low E glass. The use of non-mass analyzed ion implanter is advantageous in such application as it generates ion implanting at different depth depending on the ions energy and mass. This allows for gaining advantage from lubricity offered as a result of the very light deposition on the surface, and at the same time the hardness provided by the intercalated ions implanted below it, providing benefits for cover glass, low E enhancement, and other similar materials. In further aspects, ion implantation is used to create other desirable film properties such anti-microbial and corrosion resistance. The ions are selected from at least one of: Zr, Ag, N, Al, Ti, Ar, Carbon, and Hydrogen.

According to some embodiments, the implantation of Zr into the final layer of the Low e coating creates a highly durable layer compared to what can be currently achieved with thin film coatings alone.

In some aspects, aluminum ions are implanted to improve environmental performance. In other aspects, Ag ions are implanted to create an anti-microbial layer. In further aspects, ion implantation is performed to reduce UV transmittance of the glass.

BRIEF DESCRIPTION OF THE DRAWINGS

Other aspects and features of the invention would be apparent from the detailed description, which is made with reference to the following drawings. It should be mentioned that the detailed description and the drawings provide various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 1A and 1B are cross-sections showing prior art low-E coating using DLC and Zirconium dioxide (zirconia), respectively.

FIG. 2 illustrates the coating enhancement by simultaneous deposition and ion implant, according to an advantageous embodiment.

FIG. 3 illustrates an ion implant chamber for non-mass analyzed implanting of Low-e coated glass, according to an embodiment of the invention.

FIG. 4 is a plot of the ion implant profiles for various species and doses.

DETAILED DESCRIPTION

Figures 5, 6, 7:
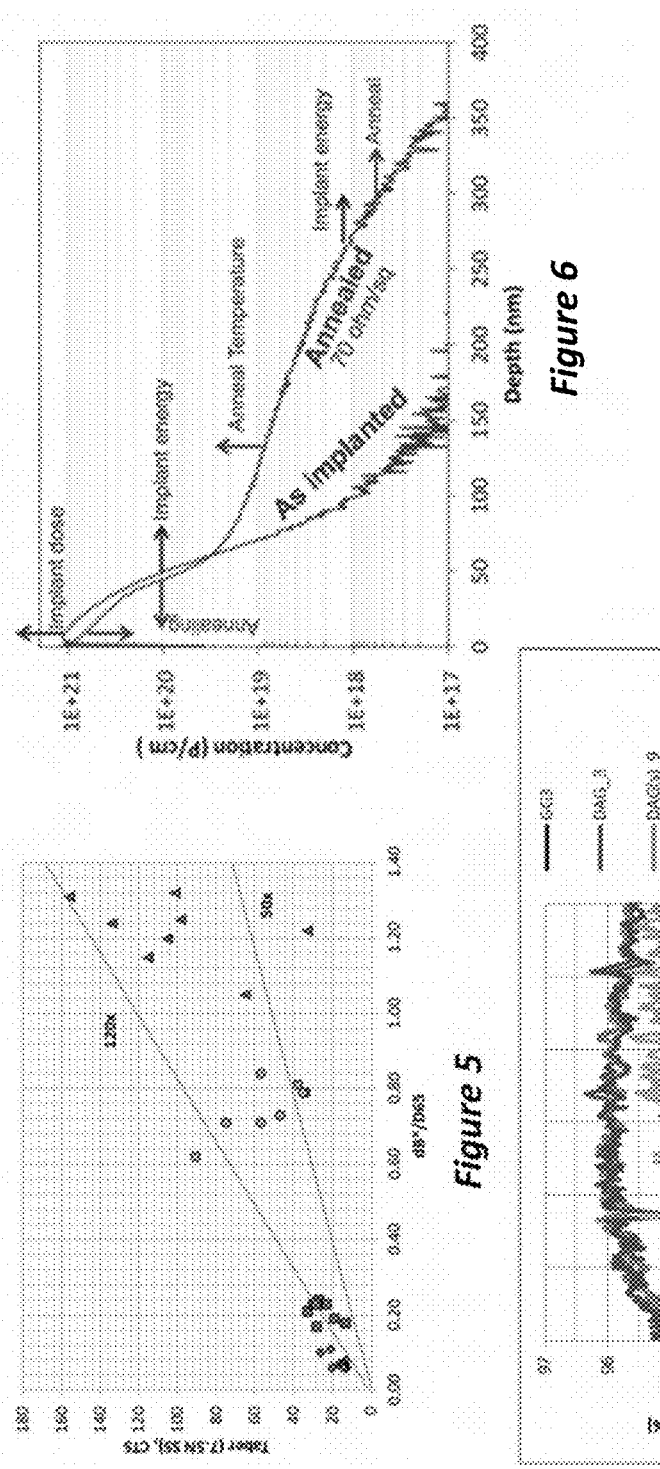
FIG. 5 is a plot showing Taber (wear rate measurements) of glass, performed at 7.5N force with SS ball.
FIG. 6 shows typical implanted atomic profile from a non-mass analyzed system.
FIG. 7 is a plot of transmission performance of various glass samples.

According to disclosed embodiments, the properties of the low-E coating on glass panels are enhanced using ion implantation. According to specific embodiments, non-mass analyzed ion beam or non-massed ion shower is used to enhance the durability, e.g., scratch resistance, of the coating on Low E glass. According to further embodiments, non-mass analyzed ion implantation is used to create other desirable film properties such as, e.g., UV transmittance, surface lubricity, anti-microbial and corrosion resistance.

According to disclosed embodiments, non-mass analyzed ions of at least one species, e.g., zirconium, aluminum, or silver, are implanted onto the top layer of the low-E coating of glass panel. Principally, introduction of at least one species into substrate creates a series of changes that are predominantly physical. For example, as shown by the embodiments disclosed herein, the implantation of Zr into the final layer of the Low e coating creates a much higher durable layer than is currently possible or cost effective with thin-film coatings alone. The implantation of aluminum into the final layer of the Low-e coating improves the environmental performance (e.g., UV reflectance) of the low-E coating. The implantation of Ag into the final layer of the Low e coating creates an anti-microbial layer.

According to further embodiments, the implant system is energized such that low energy non-mass analyzed ions of at least one species are deposited on top of the coating surface, while higher energy ions are implanted below the surface—into the coating of the glass. Intercalation and deposition of ions species is achieved simultaneously by proper control of the implantation conditions adopted. In the disclosed embodiments, this capability is enabled by the use of non-mass analyzed implant system, where control of the source allows for deposition of very low energy free radical, while control of the applied voltage and implant time provides the level of intercalation desired. This allows for gaining advantages from lubricity offered as a result of the very light deposition on the surface, while at the same time obtaining the hardness provided by the intercalated implanted ions below it, thus providing benefits for cover glass, low-E enhancement and other similar materials. Furthermore, by proper management of power, voltage and process time, novel material stoichiometry can be generated, for example $Si_3N_4$ can be formed as nitrogen rich $SiN_x$, where $x>4/3$, which can provide unique electrical and mechanical properties.

FIG. 2 illustrates the coating enhancement by simultaneous deposition and ion implant, according to an advantageous embodiment. In FIG. 2, reference 200 indicates the molecular structure of the coating, e.g., the bonding of silicon and oxygen atoms. By adjusting the power of the implanter, free radicals 205 and low energy ions may form a deposited lubricious surface, in this example of 5 Angstrom thickness or less. Simultaneously, by proper management of the implanter voltage, ions 210 are implanted below the surface of the coating, such that the ions are intercalated within the atomic structure of the coating.

FIG. 3 illustrates an ion implant chamber 300 for non-mass analyzed implanting of low-e coated glass, according to an embodiment of the invention. The chamber is evacuated by vacuum pump 310 and gas containing the species to be implanted is provided from gas source 312 into the vacuum chamber 300 at low pressure. Then an RF applicator 315, e.g., RF power source with antenna (not shown), couples RF energy into the chamber, thereby igniting and maintaining plasma 305. An extractor 320, e.g., one or more biased grids, extracts ion species 325 from the plasma 305. Depending on the voltage and power setting of the RF applicator 315, some low energy radicals may be deposited on top of the surface of the substrate 330, while higher energy ions would be implanted below the surface of the substrate 330. In this respect, substrate 330 may be placed on top of a substrate holder 335 or may simply ride on rollers or conveyor (not shown) without a substrate holder. Unlike traditional ion implanters, the implanter of FIG. 3 has no mass analyzer, such that the ions 325 are of varied energy levels within a specified energy band, set by the power and voltage setting of the RF applicator.

The flowing are calculations for three scenarios of non-mass analyzed implantation of low-e glass. For all of the options, we first looked at viability of the range of dose and energy to achieve the enhancement effect. The summary table describes two energies and the required dose.

|  |  | Zr into $SiN_x$ (125 A, 140 keV) | Zr into $SiN_x$ (250 A, 200 keV) | Al into $SiN_x$ (125 A, 30 keV) | Al into $SiN_x$ (250 A, 40 keV) | Ag into $ZrO_x$ (600 A, 65 keV) |
|---|---|---|---|---|---|---|
| Energy | keV | 140 | 200 | 30 | 40 | 65 |
| Proj Range | A | 125 | 163 | 127 | 162 | 210 |
| Delta Rp | A | 100 | 131 | 90 | 115 | 85 |
| % Dilution | % | 10% | 10% | 10% | 10% | 5% |
| sqrt(2 * pi) |  | 2.51 |  |  |  |  |
| Dose | cm−2 | 2.59E+18 | 3.39E+18 | 2.33E+18 | 2.98E+18 | 8.86E+17 |
| Atmoic density | cm−3 | 1.03E+23 | 1.03E+23 | 1.03E+23 | 1.03E+23 | 8.32E+22 |
| Desired Depth | A | 125 | 250 | 125 | 250 | 300 |

FIG. 4 is a plot of the ion implant profiles for the scenarios indicated in the above table. In the plot, two energies are shown for Zr and Al, and one for Ag. The dashed lines show the thickness of the layer being implanted for implantation into coatings made of SiNx and ZrOx. While the dose is almost the same for SiNx and ZrOx, the resulting implant is deeper when implanting into a coating made of ZrOx.

Ion implantation generates high compressive stress that can lead to hardening of the near surface region by several orders of magnitude in young's modulus. This is achieved by introduction of material in between the substrate atoms, where space is limited and, depending on the size of introduced ions, can deform the substrate and create compressive stresses. For glass application, this can manifest itself as hardening and improved wear rate of the top surface, leaving the bulk of the glass to maintain the desired optical properties. The wear rate improvement is demonstrated by various methods through scratching, continuous rubbing of the surface with harder materials and other similar techniques. The hardness can be tested via ring or ring testing or increased force wear rate methods.

For example, Taber wear testing shows that as color changes, due to the implant dose/time changes, the wear rate (Taber) changes. Using $\Delta E^*$ of 1, i.e., imperceptible color change, wear rate of 100+ can be achieved, depending on the implant conditions such as energy, dose, and other conditions. In this respect, $\Delta E^* = [\Delta L^{*2} + \Delta a^{*2} + \Delta b^{*2}]1/2$, as defined by the Commission Internationale de l'Eclairage (CIE).

FIG. 5 is a plot showing Taber (wear rate measurements) at 7.5N force with SS ball, wherein the y-axis is the number of cycles before a scratch is detected on the surface and the x-axis is the change in color of the glass, after implant at various doses and conditions depicted by delta b* (db*).

Wear testing may be too aggressive for some Low-E glass, so a gentler testing with cheese cloth can be used. The wear after many cycles of cheese cloth rubbing can be inspected by comparing the haze (introduction of scratches) and light transmission (removal of the top layer film) before and after the cycle. Implanted samples obtained according to disclosed embodiments showed no real change after many of these cycles, as noted in the table below—showing an implanted low-E glass after 250 cycles of cheese cloth with 9 N of force over a 50 mm length. The T is a measure of transmission and H is a measure of haze. The critical parameter is the change in these two factors. A minimal change shows that implant has hardened the surface.

| CM-5 Test: Cheesecloth, 9N 50 mm, 250 strokes | | | |
|---|---|---|---|
| LE CH4-1MP 433 dc | Pre | Post | Δ_Pre − Post |
| T | 74.9 | 75 | −0.1 |
| H | 0.1 | 0.12 | −0.02 |
| T | 75.7 | 75.7 | 0 |
| H | 0.09 | 0.09 | 0 |
| T | 75.8 | 75.7 | 0.1 |
| H | 0.12 | 0.16 | −0.04 |

No conditioning

| Low E glass implantation - chees cloth testing 9N of Force, 50 mm strip, 250 strokes | | | | |
|---|---|---|---|---|
| Test Number | Measurment type | Pre testing | Post testing | Difference |
| 1 | Transmission | 74.9 | 75.0 | −0.1 |
| 2 | | 75.7 | 75.7 | 0.0 |
| 3 | | 75.8 | 75.7 | 0.1 |
| 1 | Haze | 0.10 | 0.12 | −0.020 |
| 2 | | 0.09 | 0.09 | 0.000 |
| 3 | | 0.12 | 0.16 | −0.040 |

Finally, the ultimate test of hardness of a material is atypical rung on ring testing where the hardened glass is placed between two rings of differing diameter and pressure is applied. The point at which failure occurs is recorded. Below, ordinary glass was used and compared with implanted glass, where a gain of 10% was achieved. The sample was only implanted on one side. It is expected that if both sides were implanted performance will improve markedly.

| Sample Type | GG3 | IMP |
|---|---|---|
| Max Force, N | | |
| Ave | 1588 | 1762 |
| Max | 1925 | 2101 |
| Min | 1244 | 1399 |

According to further embodiments, ion implant is used to change the electrical properties of the coating of low-E glass. The implanted ions, depending on their polarity, can be activated, via a thermal step, to migrate to interstitial sites and contribute to the electrical property of the coating. For Low-E glass where conductive layers are applied as coating, certain implanted ions or molecules can change the electrical properties and enhance the performance of the coating.

FIG. 6 shows typical implanted atomic profile from a non-mass analyzed system, in silicon, where the implanted species are very close to the surface and only affect the very near surface regions, with a sharp drop off in depth, not affecting the bulk. The sample is then annealed and the plotted profile shows the dopant have been activated, by causing them to move around and find the interstitials sites to be able to contribute to the electron cloud within the coating.

Reflectance and transmission of the low-E glass and cover glass can also be modified via the implant physical process, where intercalating the right atoms in the coating or the substrate can help with obscuring certain wavelengths. For example, it could be used for UV tailoring, where transmission of certain wavelength light can be attenuated. FIG. 7 is a plot of transmission performance of various glass samples. The implanted samples (IMP_#) show drastic attenuation of the transmission starting at about 500 nm wavelength and enhancing the attenuation at wavelengths below 500 nm. Varying the implant conditions will provide the ability to tailor the cutoff frequency and the amount of attenuation.

Figure 8:
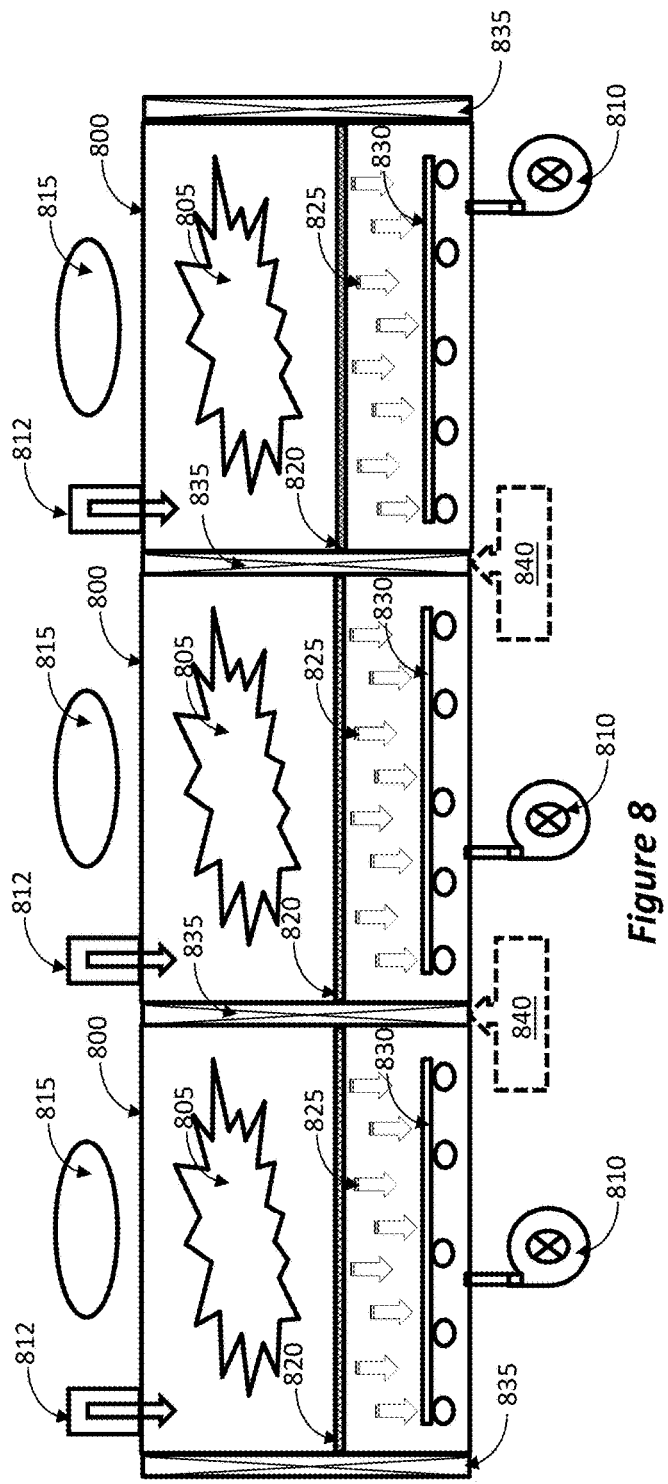
FIG. 8 illustrates an embodiment that enables serially implanting the glass with different doses and/or different species.

FIG. 8 illustrates an embodiment that enables serially implanting the glass with different doses and/or different species. The system has multiple chambers similar to the chamber illustrated in FIG. 3, so reference number in FIG. 8 are the same as in FIG. 3, except that they are in the 8xx series. A vacuum gate 835 is provided in the entrance to the system, between each two chambers, and at the exit from the system. This enables maintaining individual vacuum environment in each of the implant chambers 800. Each chamber 800 may have different gas injected to it from its corresponding gas supply 812. Each chamber may also operate at different voltage and/or different power level, provided by its corresponding RF power supply 815. This may be useful to provide a better than Gaussian distribution within the depth required. Of course, all of the chambers may use the same gas at the same voltage and power levels, such that the system implants the required total implant dose in multiple stages. This also will help with cooling of the glass during its transfer from one chamber to the next. Alternatively, cooling stations 840 may be provided in between implant chambers 800.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

The invention claimed is:

1. A low-E glass panel comprising:
a glass panel;
a low emissivity coating having a top surface exposed to surrounding environment;
a plurality of ions implanted to intercalate among molecular species to a defined depth below the top surface of the low emissivity coating, wherein the ions are selected from at least one of: Zr, Ag, Al, Ti, and Hydrogen.

2. The low-E glass panel of claim 1, wherein the ions are selected from at least one of: Zr, Ag, and, Al.

3. The low-E glass panel of claim 1, wherein the low emissivity coating comprises a plurality of layers with a top layer having the top surface exposed to surrounding environment, and wherein the ions are intercalated among molecular species of only the top layer.

4. The low-E glass panel of claim 1, wherein the low emissivity coating comprises a layer of SiNx and wherein the ions comprise Zr ions implanted into the SiNx layer.

5. The low-E glass panel of claim 1, wherein the low emissivity coating comprises a layer of SiNx and wherein the ions comprise aluminum ions implanted into the SiNx layer.

6. The low-E glass panel of claim 1, wherein the low emissivity coating comprises a layer of ZrOx and wherein the ions comprise Ag ions implanted into the ZrOx layer.

7. A low-E glass panel comprising:
a glass panel;
a low emissivity coating;
a lubricious layer comprising ions deposited onto top surface of the low emissivity coating; and,
a plurality of ions implanted to intercalate among molecular species to a defined depth below the top surface of the low emissivity coating, wherein the ions are selected from at least one of: Zr, Ag, Al, Ti, and Hydrogen.

8. The low-E glass panel of claim 7, wherein the lubricious layer has a thickness of 5 angstrom or less.

9. A low-E glass panel comprising:
a glass panel;
a low emissivity coating having a top surface facing surrounding environment;
a plurality of silver ions implanted to intercalate among molecular species of the low emissivity coating to a defined depth below the top surface of the low emissivity coating, thereby forming an anti-microbial layer on the top surface.

10. A low-E glass panel comprising:
a glass panel;
a low emissivity coating having a top surface facing surrounding environment;
a plurality of aluminum ions implanted to intercalate among molecular species of the low emissivity coating to a defined depth below the top surface of the low emissivity coating, thereby improving the UV reflectance of the low emissivity coating.

* * * * *